(12) United States Patent
Chen

(10) Patent No.: US 11,527,741 B2
(45) Date of Patent: Dec. 13, 2022

(54) DISPLAY PANEL WITH SCATTERING PARTICLES, DISPLAY DEVICE, AND MANUFACTURING METHOD OF DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Zesheng Chen, Wuhan (CN)

(*) Notice: Subject to any disclaimer, the term of this patent is extended or adjusted under 35 U.S.C. 154(b) by 227 days.

(21) Appl. No.: 16/637,773

(22) PCT Filed: Dec. 18, 2019

(86) PCT No.: PCT/CN2019/126198
§ 371 (c)(1),
(2) Date: Feb. 10, 2020

(87) PCT Pub. No.: WO2021/051687
PCT Pub. Date: Mar. 25, 2021

(65) Prior Publication Data
US 2022/0006061 A1 Jan. 6, 2022

(30) Foreign Application Priority Data
Sep. 19, 2019 (CN) .......................... 201910888781.5

(51) Int. Cl.
*H01L 51/52* (2006.01)
*H01L 51/56* (2006.01)
*H01L 27/32* (2006.01)

(52) U.S. Cl.
CPC ...... *H01L 51/5284* (2013.01); *H01L 51/5268* (2013.01); *H01L 51/56* (2013.01); *H01L 27/322* (2013.01)

(58) Field of Classification Search
CPC combination set(s) only.
See application file for complete search history.

(56) References Cited

U.S. PATENT DOCUMENTS

| | | | |
|---|---|---|---|
| 2004/0136064 A1* | 7/2004 | Honda | G03B 21/60 359/455 |
| 2020/0224047 A1* | 7/2020 | Yoshihara | C08J 11/16 |
| 2020/0258944 A1* | 8/2020 | Joo | H01L 27/322 |
| 2020/0273918 A1* | 8/2020 | Bang | H01L 27/3211 |
| 2020/0343310 A1* | 10/2020 | Bae | H01L 27/322 |
| 2021/0074770 A1* | 3/2021 | Choe | G02B 5/0278 |

FOREIGN PATENT DOCUMENTS

| | | |
|---|---|---|
| CN | 108628034 A | 10/2018 |
| CN | 108957836 A | 12/2018 |
| CN | 109686869 A | 4/2019 |
| CN | 109801955 A | 5/2019 |
| CN | 110071144 A | 7/2019 |
| CN | 110246872 A | 9/2019 |

* cited by examiner

*Primary Examiner* — Nduka E Ojeh

(57) ABSTRACT

The present invention provides a display panel, a display device, and a manufacturing method of a display panel. A side wall of a black matrix unit is arranged at an inclined angle, so light is more easily emitted from a black matrix, and a light emission angle is increased. Accordingly, a light transmittance and a viewing angle of an organic light-emitting diode (OLED) are increased. Therefore, the display performance of the OLED is effectively improved.

8 Claims, 3 Drawing Sheets

DISPLAY PANEL WITH SCATTERING PARTICLES, DISPLAY DEVICE, AND MANUFACTURING METHOD OF DISPLAY PANEL

The present application claims priority to Chinese patent application no. 201910888781.5, entitled "Display Panel, Display Device, and Manufacturing Method of Display Panel", filed on Sep. 19, 2019, the entire contents of which are incorporated by reference in this application.

1. FIELD OF DISCLOSURE

The present disclosure relates to a field of display technology and in particular, to a display panel, a display device, and a manufacturing method of the display panel.

2. DESCRIPTION OF RELATED ART

Currently, organic light-emitting diodes (OLEDs) have advantages such as excellent display performance, being self-luminous, a simple structure, being ultra-thin and light, fast response speed, wide viewing angles, low power consumption, and flexible displays.

Operation principles of OLED light emission is that organic semiconductor materials and light-emitting materials are driven by an electric field to cause light emission through carrier injection and recombination. Specifically, OLED display devices usually use indium tin oxide (ITO) pixel electrodes and metal electrodes as anodes and cathodes, respectively. Driven by a certain voltage, electrons and holes are injected from the cathodes and the anodes into an electron transport layer and a hole transport layer. The electrons and the holes are transferred to a light-emitting layer through the electron transport layer and the hole transport layer, and meet in the light-emitting layer to form excitons and excite light-emitting molecules. The light-emitting molecules emit visible light after radiation relaxation.

As development of OLED technology, there has been a trend to reducing thicknesses of films/layers of the flexible display technology. To meet this trend, a method of using a color filter instead of a polarizer is utilized, so that a light transmittance of an OLED device is greatly improved, and a thickness of a panel module is significantly reduced. The method gets great attention and is used extensively in cutting-edge flexible displays. A black matrix light-absorbing layer is used to control reflectivity of a surface of the display panel and a light transmittance of an OLED light-emitting layer. However, the black matrix light-absorbing layer affects the light transmittance and reflectivity, so viewing angles of the OLED are limited, and display quality of the OLED device is compromised.

SUMMARY

The present invention provides a display panel, a display device, and a manufacturing method of a display panel to avoid the influence of a black matrix light-shielding layer on a light transmittance and reflectivity. The present invention solves problems resulting from using a color filter instead of a polarizer. The problems are that an organic light-emitting diode has smaller viewing angles and poor display performance.

Accordingly, in one aspect, the present application provides a display panel, comprising:
 a display plate;
 an encapsulation layer disposed on the display plate; and
 a color filter substrate disposed on the encapsulation layer, wherein the color filter substrate comprises a light shielding region, the light shielding region is provided with a black matrix, and a side wall of each of at least one black matrix unit in the black matrix is arranged at an inclined angle.

The side walls of all the black matrix units in the black matrix are each arranged at the inclined angle.

An inclined groove is formed between adjacent black matrix units in the black matrix.

The groove is filled with scattering particles.

A structure of each of the scattering particles has various shapes, and the shapes comprise a spherical shape and a regular polyhedral shape.

The scattering particles are transparent.

The inclined angle is (0°, 90°).

In another aspect, the present application provides a display device comprising a display panel, the display panel comprising:
 a display plate;
 an encapsulation layer disposed on the display plate; and
 a color filter substrate disposed on the encapsulation layer, wherein the color filter substrate comprises a light shielding region, the light shielding region is provided with a black matrix, and a side wall of each of at least one black matrix unit in the black matrix is arranged at an inclined angle.

The side walls of all the black matrix units in the black matrix are each arranged at the inclined angle.

An inclined groove is formed between adjacent black matrix units in the black matrix.

The groove is filled with scattering particles.

A structure of each of the scattering particles has various shapes, and the shapes comprise a spherical shape and a regular polyhedral shape.

The scattering particles are transparent.

The inclined angle is (0°, 90°).

In still another aspect, the present application provides a manufacturing method of a display panel, comprising following steps:
 providing a display plate;
 forming an encapsulation layer on the display plate;
 forming a black matrix on the encapsulation layer; and
 processing a side wall of each of at least one black matrix unit in the black matrix to obtain the black matrix unit whose side wall is arranged at an inclined angle.

The manufacturing method further comprises processing the side walls of all the black matrix units in the black matrix to obtain the black matrix units whose side walls are each arranged at the inclined angle.

Advantages of the Present Invention

The present invention provides a display panel. The display panel comprises: a display plate; an encapsulation layer disposed on the display plate; and a color filter substrate disposed on the encapsulation layer. The color filter substrate comprises a light shielding region, and the light shielding region is provided with a black matrix. A side wall of each of at least one black matrix unit in the black matrix is arranged at an inclined angle. By arranging the side wall of the black matrix unit at the inclined angle, light is more easily emitted from the black matrix, and a range of light emission angles is increased, thereby increasing a light transmittance and a range of viewing angles of an OLED device, thus effectively improving display quality of the OLED device.

BRIEF DESCRIPTION OF DRAWINGS

In order to more clearly illustrate the embodiments of the present disclosure or related art, figures which will be described in the embodiments are briefly introduced hereinafter. It is obvious that the figures are merely for the purposes of illustrating some embodiments of the present disclosure, and a person having ordinary skill in this field can obtain other figures according to these figures without an inventive work.

DETAILED DESCRIPTION OF EMBODIMENTS

Figure 1:
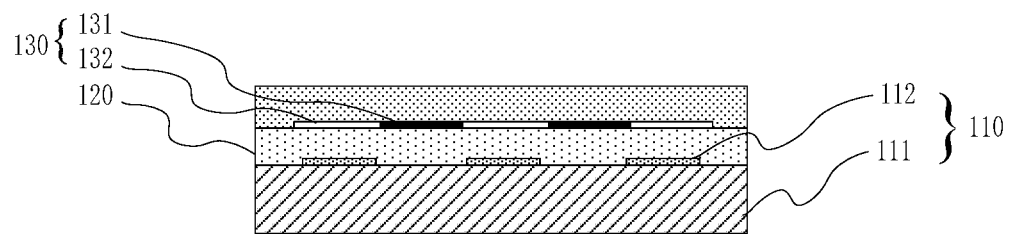
FIG. 1 is a schematic structural view illustrating a display panel according to one embodiment of the present application.

Technical solutions of the present invention will be clearly and completely described below in conjunction with the embodiments with reference to the accompanying drawings. It is apparent that the embodiments are only some embodiments of the present invention, and not all of the embodiments. All other embodiments obtained by those skilled in the art based on the embodiments of the present disclosure without an inventive step are deemed to be within the protection scope of the present invention.

In the present disclosure, it should be understood that the terms, such as "center", "longitudinal", "transverse", "length", "width", "thickness", "upper", "lower", "front", "rear", "left", "right", "vertical", "horizontal", "top", "bottom", "inner", and "outer", indicate orientations or positional relationships based on the drawings, and are only for ease of the description. These directional terms are not intended to indicate or imply the device or element referred to must have a specific orientation or be constructed and operated in a specific orientation, and therefore cannot be understood as limitations on the present application. In addition, the terms "first" and "second" are used for illustrative purposes only and cannot be understood as indicating or implying relative importance or implicitly indicating the number of technical features indicated. Therefore, the features defined with "first" and "second" can explicitly or implicitly include one or more of the features. In the present application, "multiple" is two or more, unless it is specifically defined otherwise.

As development of organic light-emitting diode (OLED) technology, there has been a trend to reducing thicknesses of films/layers of the flexible display technology. To meet the trend, a method of using a color filter instead of a polarizer is adopted, so that a light transmittance of an OLED is greatly improved, and a thickness of a panel module is significantly reduced. This method gets great attention and is used extensively in cutting-edge flexible displays. A black matrix light-absorbing layer is used to control reflectivity of a surface of the display panel and a light transmittance of an OLED light-emitting layer. However, the black matrix light-absorbing layer affects a light transmittance and reflectivity, so viewing angles of the OLED are limited, and display quality of the OLED is compromised.

Accordingly, the present invention provides a display panel, a display device, and a manufacturing method of a display panel. A detailed description is provided below.

First, the present invention provides a display panel, the display panel comprises:

a display plate;

an encapsulation layer disposed on the display plate; and a color filter substrate disposed on the encapsulation layer, wherein the color filter substrate comprises a light shielding region, the light shielding region is provided with a black matrix, and a side wall of each of at least one black matrix unit in the black matrix is arranged at an inclined angle.

Referring to FIG. 1, it is a schematic structural view illustrating a display panel according to one embodiment of the present application, wherein the display panel comprises:

(1) a display plate 110.

The display plate 110 is a semi-finished product of a display panel. The display plate 110 comprises an array substrate 111 and a light emitting device 112. The light emitting device 112 further comprises an anode, a hole transport layer, a light emitting layer, an electron transport layer, and a cathode.

(2) An encapsulation layer 120 disposed on the display plate 110.

Generally speaking, organic light emitting diode (OLED) encapsulation mainly refers to isolate an OLED from an environment to prevent the damage from H2O, O2, dust, and external forces, thereby stabilizing parameters of the OLED and increasing a lifespan of the OLED. Active metal cathodes and organic light-emitting materials of the OLED are very sensitive to H2O and O2. Erosion caused by a small amount of H2O and O2 seriously affects display quality and the lifespan of the OLED. Therefore, using OLED encapsulation to isolate H2O and O2 is one of the keys to making progress in the OLED industry.

(3) A color filter substrate 130 disposed on the encapsulation layer 120. The color filter substrate 130 comprises a light shielding region and a light transmissive region 132. The light shielding region is provided with a black matrix 131, and a side wall of each of at least one black matrix unit in the black matrix 131 is arranged at an inclined angle.

Figure 2:
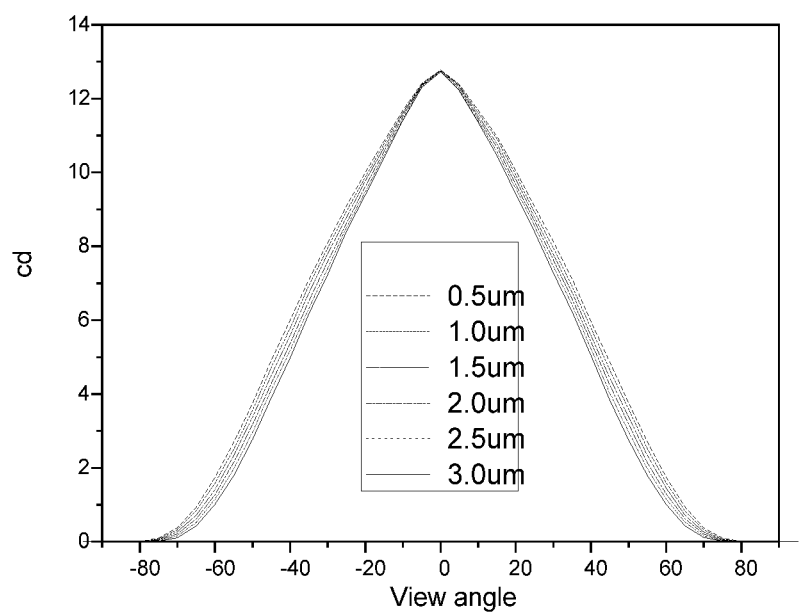
FIG. 2 is a schematic view illustrating that a thickness of a black matrix affects a viewing angle according to one embodiment of the present invention.

The side wall of the black matrix unit is arranged at the inclined angle, and the inclined angle is the angle between the side wall of the black matrix and a vertical direction. The present application is based on a technology of using a color filter instead of a polarizer to effectively reduce a module thickness of a panel. Referring to FIG. 2, it is a schematic view illustrating that a thickness of the black matrix affects a viewing angle according to one embodiment of the present invention. As shown in FIG. 2, the thickness of the black matrix affects the viewing angle. In a range shown in FIG. 2, it can be known that, when the thickness of the black matrix is thinner, the viewing angle is larger.

In detail, the color filter substrate 130 comprises a glass substrate, the black matrix 131, and red/green/blue (three primary colors) color resists. The red/green/blue color resists are arranged corresponding to sub-pixels of pixels of the light emitting device 112. To be specific, the red color resist is disposed corresponding to the red sub-pixel, and the black matrix 131 is arranged between adjacent color resists and is configured to block scattered light, thereby preventing color mixing between the sub-pixels and preventing a portion of a spectrum in natural light from forming a primary color in the mixed color through a matching monochrome spectrum.

Figure 3:
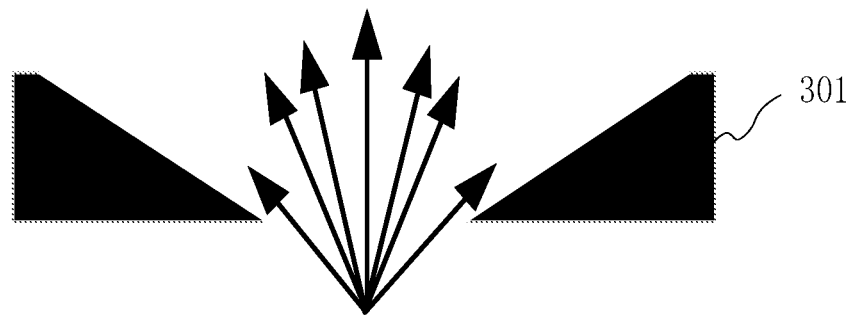
FIG. 3 is a schematic view illustrating a side wall of a black matrix unit arranged at an inclined angle according to one embodiment of the present invention.

Referring to FIG. 3, it is a schematic view illustrating that the side wall of the black matrix unit is arranged at the inclined angle according to one embodiment of the present invention.

When the light emitted by the light-emitting device passes through the black matrix 301, a portion of oblique light is not blocked by the black matrix, thus making it easier for the light to be emitted from the black matrix and increasing a range of a light emission angle, thereby increasing a light transmittance and a range of viewing angles of the OLED, and effectively improving the display quality of the OLED.

The present invention provides a display panel, the display panel comprises:

a display plate;

an encapsulation layer disposed on the display plate; and a color filter substrate disposed on the encapsulation layer, wherein the color filter substrate comprises a light shielding region, the light shielding region is provided with a black matrix, and a side wall of each of at least one black matrix unit in the black matrix is arranged at an inclined angle.

By arranging the side wall of the black matrix unit at the inclined angle, light is more easily emitted from the black matrix, and a range of light emission angles is increased, thereby increasing a light transmittance and a range of viewing angles of an OLED, thus effectively improving display quality of the OLED.

Based on the above embodiment, the present application provides another embodiment, wherein the side walls of all the black matrix units in the black matrix are each arranged at the inclined angle.

Generally speaking, the viewing angle of a liquid crystal display (LCD) includes two indicators: a horizontal viewing angle and a vertical viewing angle. The horizontal viewing angle indicates that, from a vertical normal of the display (that is, the vertical imaginary line in the middle of the display), a displayed image can still be seen normally at certain angles from the left or right of the vertical normal, and then a range of these angles is the horizontal viewing angle of the LCD. Similarly, when a horizontal normal is taken as a baseline, the viewing angles up and down the horizontal normal are called vertical viewing angles. As the viewing angle changes, a contrast ratio changes. When the viewing angle is increased, the contrast ratio of the displayed image observed at that position decreases; and when the viewing angle is increased to a certain degree that the contrast ratio is reduced to 10:1, this angle is the maximum viewing angle of the LCD. In the present application, the side walls of all the black matrix units in the black matrix are arranged at the inclined angles, so horizontal viewing angle and vertical viewing angle (the two indicators) are greatly increased, thereby the viewing angle of the OLED is greatly increased.

According to another embodiment of the present application based on the above embodiment, an inclined groove is formed between adjacent black matrix units in the black matrix.

In the present invention, because a height of the black matrix in the color filter substrate is higher than heights of the red, green, and blue color resists, the inclined groove is formed in the black matrix.

According to another embodiment of the present application based on the above embodiment, the groove is filled with scattering particles.

Figure 4:
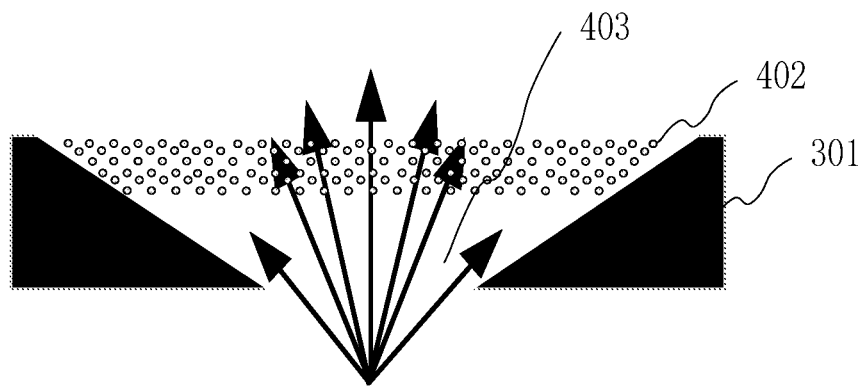
FIG. 4 is a schematic view illustrating a groove filled with scattering particles according to one embodiment of the present invention.

FIG. 4 is a schematic view illustrating the groove filled with the scattering particles according to one embodiment of the present invention.

In the present invention, since the groove 403 is filled with the scattering particles 402, the scattering particles scatter light when light emitted by the light emitting device passes through the scattering particles. Therefore, the horizontal viewing angle and the vertical viewing angle, i.e. the two indicators, are increased, and as a result, the viewing angle of the OLED can be increased more effectively.

According to one embodiment of the present invention based on the above embodiment, the structure of the scattering particles has various shapes, and the shapes include a spherical shape and a regular polyhedral shape. The present application does not limit the structure of the scattering particles, and the structure may vary according to actual situations.

According to one embodiment of the present invention based on the above embodiment, the scattering particles are transparent.

Specifically, the present invention needs to scatter ambient light and improve the viewing angles of the display panel without affecting the light transmittance of the display panel. Therefore, it is necessary to select the scattering particles that have a high light transmittance for visible light and are colorless and transparent. For example, the scattering particles can be $SiO_2$ or TiO; however, the type of the scattering particles is not limited in the present application, and the type of the scattering particles can vary according to actual conditions.

According to one embodiment of the present application based on the above embodiment, the inclined angle is (0°, 90°). For example, the inclined angle is 30°. In the present application, one black matrix unit of the black matrix has the inclined angle, or alternatively, multiple black matrix units of the black matrix each have the inclined angle. When multiple black matrix units in the black matrix each have the inclined angle, the black matrix units can be arranged at the same inclined angle or different inclined angles. For example, the black matrix includes a black matrix unit 1 and a black matrix unit 2; the black matrix unit 1 is arranged at an inclined angle 1, the black matrix unit 2 is arranged at an inclined angle 2, the inclined angle 1 and the inclined angle 2 can both be 30°, and it is also possible to set the inclined angle 1 to be 30° and set the inclined angle 2 to be 45°. The inclined angle of each of the black matrix units in the black matrix can be set according to actual conditions, and the present application is not limited in this regard.

Figure 5:
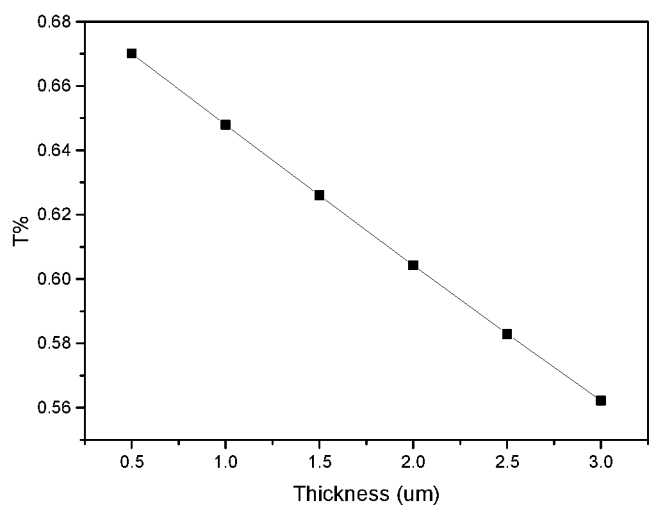
FIG. 5 is a schematic view illustrating an influence of the thickness of the black matrix on a light transmittance of a black matrix opening of a same size according to one embodiment of the present invention.

FIG. 5 is a schematic view illustrating an influence of the thickness of the black matrix on a light transmittance of a black matrix opening of a same size according to one embodiment of the present invention. It can be known from the data in FIG. 5 that, the thickness of the black matrix is inversely proportional to the light transmittance of the black matrix opening.

Figure 6:
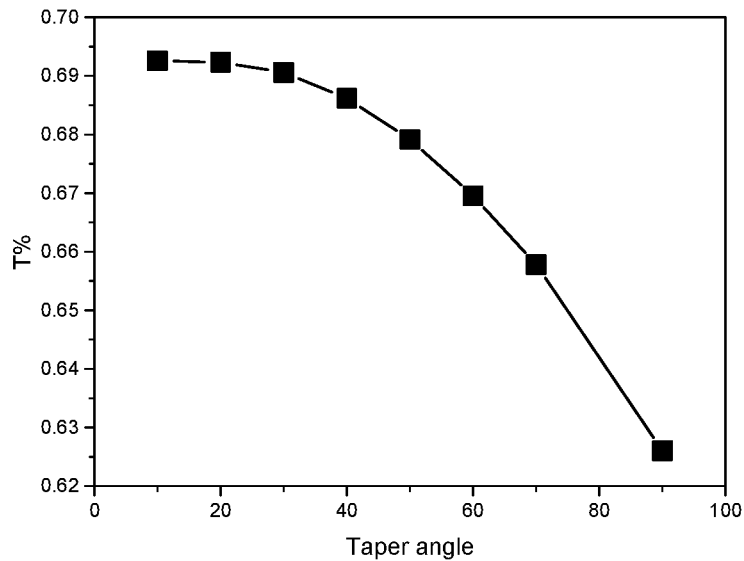
FIG. 6 is a schematic view illustrates that a taper angle of a side wall of the black matrix opening influences the light transmittance according to one embodiment of the present invention.

FIG. 6 is a schematic view illustrates that a taper angle defined by side walls of the black matrix opening influences the light transmittance according to one embodiment of the present invention.

One opening is defined by the side walls of the two adjacent black matrix units. As shown in FIG. 6, the taper angle defined by the side walls of the black matrix opening is from 10° to 90°. The light transmittance of the black matrix opening increases or decreases as the taper angle defined by the side walls of the black matrix opening changes. In detail, the larger the taper angle of the black matrix opening is, the lower the light transmittance of the black matrix opening is.

According to one embodiment of the present application based on the above embodiment, the inclined angle is [10°, 20°]. When the inclined angle is within this range, the effect is more excellent. The inclined angle is, for example, 20°.

According to one embodiment of the present application based on the above embodiment, a longitudinal section of the groove has a trapezoidal shape.

In order to better implement the display panel of the present invention, the present invention further provides a display device based on the display panel, and the display device includes the display panel of the foregoing embodiment.

The display panel of the above embodiment is utilized, and the side wall of the black matrix unit is arranged at the inclined angle, so that light is more easily emitted from the black matrix, and the light emission angle is increased, thereby increasing the light transmittance and the viewing angle of the OLED, thus effectively improving the display performance of the OLED and also improving the display performance of the display device.

In order to better implement the display panel in the embodiment of the present invention, the present invention further provides a manufacturing method of a display panel. The manufacturing method of the display panel comprises following steps:

providing a display plate;

forming an encapsulation layer on the display plate;

forming a black matrix on the encapsulation layer; and processing a side wall of each of at least one black matrix unit in the black matrix to obtain the black matrix unit whose side wall is arranged at an inclined angle.

Figure 7:
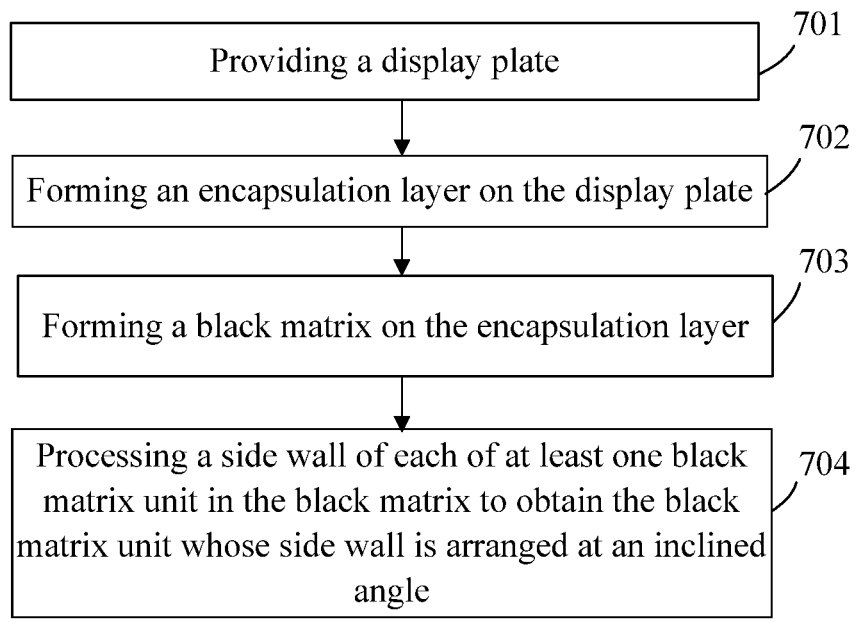
FIG. 7 is a process flow diagram illustrating a manufacturing method of the display panel according to one embodiment of the present invention.

FIG. 7 is a process flow diagram illustrating a manufacturing method of a display panel according to one embodiment of the present invention. The manufacturing method comprises:

Step 701: providing a display plate.

Specifically, the display plate is a semi-finished product of a display panel. The display plate comprises an array substrate and a light emitting device. The light emitting device is formed on the array substrate. The light emitting device further includes an anode and a hole transport layer, a light emitting layer, an electron transport layer, and a cathode.

Step 702: forming an encapsulation layer on the display plate.

The encapsulation layer can use cover plate encapsulation technology or thin film encapsulation technology. The encapsulation method is not limited in the present application, and the encapsulation method may vary according to actual requirement.

Specifically, the cover plate encapsulation technology is generally used for an OLED with a rigid substrate such as a glass substrate. The manufactured substrate of the OLED device is sent into a glove box from a loading chamber of an OLED system. An inert gas environment in the glove box requires water and oxygen contents below one ppm, and then, a cover plate is transferred from the loading chamber to a plasma processing chamber and is subjected to a PT treatment, so that a surface of the cover plate is activated, and thereby an epoxy resin ultraviolet curable adhesive has good wettability on the surface of the cover plate and is tightly connected to it. The PT-treated cover plate is transferred into the glove box, and a desiccant sheet is attached to absorb water which is generated during the above steps for the OLED device and may still remain in a sealed space after encapsulation is completed. Then, a freedom adhesive coating machine which is programmed and adjusts a width of the ultraviolet curable adhesive is used to complete applying the epoxy resin ultraviolet curable adhesive. Both the substrate and the cover plate are put into a vacuum chamber, then they are bonded together under a vacuum environment, and finally they are put into an ultraviolet exposure machine and exposed and heat-cured at about 60° C. This way, an organic functional layer and an electrode sandwiched between the cover plate and the substrate are sealed to isolate water, oxygen, and dust in outside atmosphere, thus preventing the functional layer of the OLED from reacting with water and oxygen in the air.

Step 703: forming a black matrix on the encapsulation layer.

The color filter substrate comprises a light transmissive region and a light shielding region. The color filter substrate includes a glass substrate, a black matrix, and red/green/blue (three primary colors) color resists. The red/green/blue color resists are disposed corresponding to sub-pixels of pixels of the light emitting device in an area which is a light transmissive region. For example, the red color resist is disposed corresponding to the red sub-pixel, and the black matrix is arranged between adjacent color resists to block scattered light. An area where the black matrix is arranged is a light shielding region to prevent color mixing between sub-pixels and to prevent a portion of a spectrum in natural light to form a primary color in the mixed color through a matching monochromatic spectrum.

In detail, a black matrix layer is applied on the encapsulation layer, and a black matrix pattern is formed after exposure and development.

Step 704: processing a side wall of each of at least one black matrix unit in the black matrix to obtain the black matrix unit whose side wall is arranged at an inclined angle.

Specifically, the side wall of each of at least one black matrix unit in the black matrix is processed to obtain the black matrix unit whose side wall has the inclined angle, wherein the black matrix is the black matrix patterned in the above step.

The present invention provides the manufacturing method of the display panel. Compared with conventional manufacturing processes, the side wall of the black matrix unit has the inclined angle, so light is more easily emitted from the black matrix, and a light emission angle is increased, thereby increasing a light transmittance and a viewing angle of the OLED, thus effectively improving the display performance of the OLED.

According to one embodiment of the present application based on the above embodiment, the manufacturing method further includes:

processing the side walls of all the black matrix units in the black matrix to form a black matrix unit whose side wall has the inclined angle.

According to one embodiment of the present application based on the above embodiment, the color filter substrate comprises a black matrix. An inclined groove is formed between adjacent black matrix units in the black matrix. The groove is filled with scattering particles.

In the above embodiments, the description of each embodiment has its own emphasis. For the parts that are not described in detail in one embodiment, please refer to the detailed descriptions in other embodiments above, and the detailed descriptions are repeated for brevity.

In practice, each of the above units or structures may be implemented as independent entities, or may be combined as the same or several entities. For the specific implementation of the above units or structures, please refer to the foregoing embodiments, and a detailed description is not repeated here for brevity.

For operation details of the above step, please refer to the foregoing embodiments, and details are not described herein again.

A display panel, a display device, and a manufacturing method of the display panel of the present invention have been described in detail above. Specific examples are used to explain the principles and embodiments of the present invention. The description of the above embodiments is only for ease of understanding of the present invention. Modifications and changes can be made by persons of ordinary skill in the art based on the ideas of the present application. Accordingly, the content of the present disclosure should not be construed as limitations on the present application.

What is claimed is:

1. A display panel, comprising:
    a display plate;
    an encapsulation layer disposed on the display plate; and
    a color filter substrate disposed on the encapsulation layer, wherein the color filter substrate comprises a light shielding region, the light shielding region is provided with only one black matrix layer, the black matrix layer comprises a black matrix, the black matrix including a plurality of black matrix units, the black matrix units comprise side walls extending through a whole thickness of the black matrix layer, and the side walls of all the black matrix units in the black matrix are each arranged at an inclined angle, wherein each inclined angle is an angle between one of the side walls of the black matrix units and a vertical direction, an inclined groove is defined between each two adjacent black matrix units in the black matrix, a cross-section of each of the inclined grooves tapers in a downward direction, the inclined grooves are each filled with scattering particles, the scattering particles are colorless and transparent and are made of $SiO_2$ or TiO, and the inclined angles range from 10° to 45°.

2. The display panel according to claim 1, wherein a structure of each of the scattering particles has various shapes, and the shapes comprise a spherical shape and a regular polyhedral shape.

3. The display panel according to claim 1, wherein the inclined angles range from 10° to 20°.

4. A display device comprising a display panel, the display panel comprising:
    a display plate;
    an encapsulation layer disposed on the display plate; and
    a color filter substrate disposed on the encapsulation layer, wherein the color filter substrate comprises a light shielding region, the light shielding region is provided with only one black matrix layer, the black matrix layer comprises a black matrix, the black matrix including a plurality of black matrix units, the black matrix units comprise side walls extending through a whole thickness of the black matrix layer, and the side walls of all the black matrix units in the black matrix are each arranged at an inclined angle, wherein each inclined angle is an angle between one of the side walls of the black matrix units and a vertical direction, an inclined groove is defined between each two adjacent black matrix units in the black matrix, a cross-section of each of the inclined grooves tapers in a downward direction, the inclined grooves are each filled with scattering particles, the scattering particles are colorless and transparent and are made of $SiO_2$ or TiO, and the inclined angles range from 10° to 45°.

5. The display device according to claim 4, wherein a structure of each of the scattering particles has various shapes, and the shapes comprise a spherical shape and a regular polyhedral shape.

6. The display device according to claim 4, wherein the inclined angles range from 10° to 20°.

7. A manufacturing method of a display panel, comprising following steps:
    providing a display plate;
    forming an encapsulation layer on the display plate;
    forming only one black matrix layer on the encapsulation layer, wherein the black matrix layer comprises a black matrix, the black matrix comprises a plurality of black matrix units; and
    processing side walls of all the black matrix units in the black matrix to obtain the black matrix units comprising side walls each arranged at an inclined angle and extending through a whole thickness of the black matrix layer, wherein each inclined angle is an angle between one of the side walls of the black matrix units and a vertical direction, an inclined groove is formed between each two adjacent black matrix units in the black matrix, a cross-section of each of the inclined grooves tapers in a downward direction, the inclined grooves are each filled with scattering particles, the scattering particles are colorless and transparent and are made of $SiO_2$ or TiO, and the inclined angles range from 10° to 45°.

8. The manufacturing method according to claim 7, further comprising:
    processing the side walls of all the black matrix units in the black matrix to obtain the black matrix units whose side walls are each arranged at the inclined angle, wherein the inclined angles range from 10° to 20°.

* * * * *